United States Patent
Xu et al.

(10) Patent No.: US 8,975,872 B2
(45) Date of Patent: Mar. 10, 2015

(54) BATTERY HEATING CIRCUITS AND METHODS WITH RESONANCE COMPONENTS IN SERIES USING VOLTAGE INVERSION BASED ON PREDETERMINED CONDITIONS

(75) Inventors: Wenhui Xu, Shenzhen (CN); Yaochuan Han, Shenzhen (CN); Wei Feng, Shenzhen (CN); Qinyao Yang, Shenzhen (CN); Wenjin Xia, Shenzhen (CN); Xianyin Li, Shenzhen (CN)

(73) Assignee: BYD Company Limited, Shenzhen (CN)

( * ) Notice: Subject to any disclaimer, the term of this patent is extended or adjusted under 35 U.S.C. 154(b) by 593 days.

(21) Appl. No.: 13/187,279

(22) Filed: Jul. 20, 2011

(65) Prior Publication Data

US 2012/0032642 A1 Feb. 9, 2012

(30) Foreign Application Priority Data

Jul. 30, 2010 (CN) ............ 2010 1 0245288
Aug. 30, 2010 (CN) ............ 2010 1 0274785
May 23, 2011 (CN) ............ 2011 1 0137264

(51) Int. Cl.
*H01M 10/46* (2006.01)
*H02J 7/00* (2006.01)
(Continued)

(52) U.S. Cl.
CPC ......... *H01L 23/345* (2013.01); *H01M 10/5006* (2013.01); *H01M 10/5016* (2013.01);
(Continued)

(58) Field of Classification Search
USPC ........................................ 320/128
See application file for complete search history.

(56) References Cited

U.S. PATENT DOCUMENTS 3,654,426 A  4/1972 Brinkmann et al.
3,808,481 A  4/1974 Rippel
(Continued)

FOREIGN PATENT DOCUMENTS

CN  1630129 A  6/2005
CN  1630130 A  6/2005
(Continued)

OTHER PUBLICATIONS

European Patent Office, Extended European Search Report dated Sep. 13, 2011, in related application EP 11166955.2.
(Continued)

*Primary Examiner* — Samuel Berhanu
*Assistant Examiner* — Jerry D Robbins
(74) *Attorney, Agent, or Firm* — Jones Day

(57) ABSTRACT

A circuit for heating a battery includes a switch unit, control module, damping component, energy storage circuit, and superposition unit. The energy storage circuit forms a loop with the battery, and includes current and charge storage components. The damping component, switch unit, current storage component, and charge storage component connect in series. The control module switches on the switch unit so current flows between the battery and energy storage circuit and switches off the switch unit to stop current flow. The superposition unit superposes energy in the energy storage circuit with energy in the battery after the switch unit switches on and off. The control module switches the switch unit off after the first positive half cycle of current flow through the switch unit after the switch unit switches on. Voltage applied to the switch unit when the switch unit switches off is lower than the switch unit's voltage rating.

19 Claims, 14 Drawing Sheets

(51) Int. Cl.
- *H01L 23/34* (2006.01)
- *H01M 10/615* (2014.01)
- *H01M 10/625* (2014.01)
- *H01M 10/657* (2014.01)
- *H01M 10/6571* (2014.01)
- *H02M 3/158* (2006.01)

(52) U.S. Cl.
CPC ...... *H01M10/5081* (2013.01); *H01M 10/5083* (2013.01); *H02J 7/0054* (2013.01); *H02J 7/0014* (2013.01); *H02M 3/158* (2013.01); *Y02T 10/7055* (2013.01); *H02J 7/0075* (2013.01); *H02J 7/0091* (2013.01); *H02J 7/0093* (2013.01); *Y02E 60/12* (2013.01)
USPC ............................ 320/128; 320/107; 320/129

(56) References Cited

U.S. PATENT DOCUMENTS

| | | | |
|---|---|---|---|
| 4,171,508 A | 10/1979 | Sinclair | |
| 4,184,197 A * | 1/1980 | Cuk et al. | 363/16 |
| 4,222,000 A | 9/1980 | Silvertown et al. | |
| 5,362,942 A | 11/1994 | Vanderslice, Jr. et al. | |
| 5,396,165 A * | 3/1995 | Hwang et al. | 323/210 |
| 5,461,556 A * | 10/1995 | Horie et al. | 363/58 |
| 5,523,671 A | 6/1996 | Stewart | |
| 5,561,597 A | 10/1996 | Limpaecher | |
| 5,768,114 A * | 6/1998 | Gruning et al. | 363/58 |
| 5,789,905 A * | 8/1998 | Yamasaki | 323/222 |
| 5,808,469 A | 9/1998 | Kopera | |
| 5,905,371 A | 5/1999 | Limpaecher | |
| 5,943,224 A | 8/1999 | Mao | |
| 5,948,298 A | 9/1999 | Ijaz | |
| 5,990,661 A | 11/1999 | Ashtiani et al. | |
| 6,002,240 A | 12/1999 | McMahan et al. | |
| 6,072,301 A * | 6/2000 | Ashtiani et al. | 320/128 |
| 6,078,163 A | 6/2000 | Horie et al. | |
| 6,211,652 B1 | 4/2001 | Glasgow | |
| 6,259,229 B1 * | 7/2001 | Ashtiani et al. | 320/128 |
| 6,340,879 B1 | 1/2002 | Bläcker | |
| 6,771,518 B2 * | 8/2004 | Orr et al. | 363/16 |
| 6,882,061 B1 | 4/2005 | Ashtiani et al. | |
| 7,292,010 B2 | 11/2007 | Hsu et al. | |
| 7,382,102 B2 | 6/2008 | Ashtiani | |
| 7,402,982 B2 | 7/2008 | Ito et al. | |
| 7,876,583 B2 | 1/2011 | Polivka et al. | |
| 8,004,866 B2 * | 8/2011 | Bucella et al. | 363/50 |
| 8,197,502 B2 * | 6/2012 | Smith et al. | 606/169 |
| 8,493,036 B2 | 7/2013 | Ferrario | |
| 2005/0077879 A1 | 4/2005 | Near | |
| 2005/0156578 A1 | 7/2005 | Kamenoff | |
| 2005/0168195 A1 | 8/2005 | MacDougall | |
| 2005/0264237 A1 | 12/2005 | Ishizuka | |
| 2007/0024243 A1 | 2/2007 | Liu et al. | |
| 2007/0091023 A1 | 4/2007 | Kosaka et al. | |
| 2007/0121258 A1 | 5/2007 | Hachiya | |
| 2009/0014436 A1 | 1/2009 | Toya et al. | |
| 2009/0243547 A1 | 10/2009 | Andelfinger | |
| 2011/0095711 A1 | 4/2011 | Hsieh et al. | |
| 2011/0144861 A1 | 6/2011 | Lakirovich et al. | |
| 2011/0273136 A1 * | 11/2011 | Yoshimoto | 320/103 |
| 2012/0024838 A1 | 2/2012 | Xu et al. | |
| 2012/0025754 A1 | 2/2012 | Xu et al. | |
| 2012/0025755 A1 | 2/2012 | Xu et al. | |
| 2012/0025756 A1 | 2/2012 | Xu et al. | |
| 2012/0025772 A1 | 2/2012 | Xu et al. | |
| 2012/0025774 A1 | 2/2012 | Xu et al. | |
| 2012/0025775 A1 | 2/2012 | Xu et al. | |
| 2012/0025776 A1 | 2/2012 | Xu et al. | |
| 2012/0025777 A1 | 2/2012 | Xu et al. | |
| 2012/0025778 A1 | 2/2012 | Xu et al. | |
| 2012/0025779 A1 | 2/2012 | Xu et al. | |
| 2012/0025780 A1 | 2/2012 | Xu et al. | |
| 2012/0025781 A1 | 2/2012 | Xu et al. | |
| 2012/0025782 A1 | 2/2012 | Xu et al. | |
| 2012/0025783 A1 | 2/2012 | Xu et al. | |
| 2012/0031890 A1 | 2/2012 | Han et al. | |
| 2012/0126753 A1 * | 5/2012 | Carkner | 320/129 |
| 2012/0161711 A1 | 6/2012 | Xu et al. | |
| 2012/0279951 A1 | 11/2012 | Xu et al. | |
| 2012/0280658 A1 | 11/2012 | Xu et al. | |
| 2012/0280659 A1 | 11/2012 | Xu et al. | |
| 2012/0299551 A1 | 11/2012 | Xu et al. | |
| 2012/0306432 A1 | 12/2012 | Xu et al. | |
| 2013/0127398 A1 | 5/2013 | Xu et al. | |
| 2013/0134146 A1 | 5/2013 | Han et al. | |
| 2013/0134945 A1 | 5/2013 | Xu et al. | |
| 2013/0141032 A1 | 6/2013 | Xu et al. | |

FOREIGN PATENT DOCUMENTS

| | | |
|---|---|---|
| CN | 1809942 A | 7/2006 |
| CN | 1836356 A | 9/2006 |
| CN | 1291518 C | 12/2006 |
| CN | 101552479 A | 10/2009 |
| CN | 201397868 Y | 2/2010 |
| CN | 101685971 A | 3/2010 |
| CN | 201435426 Y | 3/2010 |
| CN | 201667552 U | 12/2010 |
| CN | 102055042 A | 5/2011 |
| CN | 102074756 A | 5/2011 |
| CN | 201936966 U | 8/2011 |
| CN | 201936967 U | 8/2011 |
| CN | 201936969 U | 8/2011 |
| CN | 201966300 U | 9/2011 |
| CN | 202009059 U | 10/2011 |
| CN | 202042567 U | 11/2011 |
| CN | 202076380 U | 12/2011 |
| CN | 202103139 U | 1/2012 |
| CN | 202121024 U | 1/2012 |
| CN | 102074755 B | 5/2012 |
| CN | 102074758 B | 6/2012 |
| CN | 102074759 B | 6/2012 |
| CN | 102074753 B | 7/2012 |
| CN | 102074756 B | 7/2012 |
| CN | 102074760 B | 7/2012 |
| CN | 102074762 B | 7/2012 |
| CN | 102074761 B | 9/2012 |
| CN | 102088117 B | 9/2012 |
| CN | 102082306 B | 11/2012 |
| CN | 102088116 B | 11/2012 |
| EP | 0 418 919 A2 | 3/1991 |
| EP | 1 930 922 A2 | 6/2008 |
| JP | 4-12472 A | 1/1992 |
| JP | 5022876 A | 1/1993 |
| JP | 2007-166779 A | 6/2007 |
| JP | 4016045 B2 | 12/2007 |
| SU | 813544 B | 3/1981 |
| TW | 220014 B | 2/1994 |
| TW | 269727 B | 2/1996 |
| TW | 344721 B | 11/1998 |
| TW | 200518370 A | 6/2005 |
| TW | 200527793 A | 8/2005 |
| TW | M275625 U | 9/2005 |
| WO | WO 2010/145439 A1 | 12/2010 |

OTHER PUBLICATIONS

European Patent Office, Extended European Search Report dated Nov. 30, 2011, in related application EP 11166938.8.
European Patent Office, Extended European Search Report dated Dec. 15, 2011, in related application EP 11166941.2.
European Patent Office, Extended European Search Report dated Sep. 16, 2011, in related application EP 11166949.5.
European Patent Office, Extended European Search Report dated Oct. 6, 2011, in related application EP 11166925.5.
European Patent Office, European Search Report dated Sep. 29, 2011, in related application EP 11166958.6.
European Patent Office, Extended European Search Report dated Jan. 25, 2012, in related application EP 11166952.9.
European Patent Office, European Search Report dated Sep. 21, 2011, in related application EP 11166969.3.

(56) References Cited

OTHER PUBLICATIONS

European Patent Office, European Search Report dated Sep. 1, 2011, in related application EP 11166903.2.
European Patent Office, Extended European Search Report dated Nov. 8, 2011, in related application EP 11166872.9.
European Patent Office, Extended European Search Report dated Nov. 25, 2011, in related application EP 11166882.8.
European Patent Office, Extended European Search Report dated Nov. 25, 2011, in related application EP 11166897.6.
European Patent Office, Extended European Search Report dated Sep. 6, 2011, in related application EP 11166900.8.
European Patent Office, Extended European Search Report dated Sep. 23, 2011, in related application EP 11166914.9.
European Patent Office, Extended European Search Report dated Nov. 8, 2011, in related application EP 11166920.6.
European Patent Office, Extended European Search Report dated Sep. 27, 2011, in related application EP 11167066.7.
European Patent Office, Extended European Search Report dated Sep. 8, 2011, in related application EP 11166902.4.
European Patent Office, Extended European Search Report dated Oct. 6, 2011, in related application EP 11167128.5.
Patent Cooperation Treaty, International Search Report and Written Opinion, dated Sep. 1, 2011, in related application PCT/CN2011/074449.
Patent Cooperation Treaty, International Search Report and Written Opinion, dated Aug. 18, 2011, in related application PCT/CN2011/074453.
Patent Cooperation Treaty, International Search Report and Written Opinion, dated Aug. 11, 2011, in related application PCT/CN2011/074463.
Patent Cooperation Treaty, International Search Report and Written Opinion, dated Aug. 25, 2011, in related application PCT/CN2011/074458.
Patent Cooperation Treaty, International Search Report and Written Opinion, dated Aug. 11, 2011, in related application PCT/CN2011/074462.
Patent Cooperation Treaty, International Search Report and Written Opinion, dated Aug. 11, 2011, in related application PCT/CN2011/074457.
Patent Cooperation Treaty, International Search Report and Written Opinion, dated Aug. 25, 2011, in related application PCT/CN2011/074459.
Patent Cooperation Treaty, International Search Report and Written Opinion, dated Aug. 18, 2011, in related application PCT/CN2011/074456.
Patent Cooperation Treaty, International Search Report and Written Opinion, dated Aug. 18, 2011, in related application PCT/CN2011/074460.
Patent Cooperation Treaty, International Search Report and Written Opinion, dated Aug. 11, 2011, in related application PCT/CN2011/074433.
Patent Cooperation Treaty, International Search Report and Written Opinion, dated Aug. 18, 2011, in related application PCT/CN2011/074436.
Patent Cooperation Treaty, International Search Report and Written Opinion, dated Aug. 25, 2011, in related application PCT/CN2011/074438.
Patent Cooperation Treaty, International Search Report and Written Opinion, dated Aug. 11, 2011, in related application PCT/CN2011/074440.
Patent Cooperation Treaty, International Search Report and Written Opinion, dated Aug. 25, 2011, in related application PCT/CN2011/074455.
Patent Cooperation Treaty, International Search Report and Written Opinion, dated Aug. 11, 2011, in related application PCT/CN2011/074461.
Patent Cooperation Treaty, International Search Report and Written Opinion, dated Sep. 1, 2011, in related application PCT/CN2011/074531.
Patent Cooperation Treaty, International Search Report and Written Opinion, dated Aug. 18, 2011, in related application PCT/CN2011/074442.
Patent Cooperation Treaty, International Search Report and Written Opinion, dated Jul. 21, 2011, in related application PCT/CN2011/074536.
United States Patent and Trademark Office, Office Action mailed Jul. 16, 2013, in related U.S. Appl. No. 13/166,281.
United States Patent and Trademark Office, Office Action mailed May 31, 2013, in related U.S. Appl. No. 13/168,004.
United States Patent and Trademark Office, Office Action mailed May 22, 2013, in related U.S. Appl. No. 13/168,014.
United States Patent and Trademark Office, Office Action mailed Jul. 5, 2013, in related U.S. Appl. No. 13/170,021.
United States Patent and Trademark Office, Office Action mailed Jul. 30, 2013, in related U.S. Appl. No. 13/166,301.
United States Patent and Trademark Office, Office Action mailed Sep. 5, 2013, in related U.S. Appl. No. 13/189,096.
United States Patent and Trademark Office, Office Action mailed Aug. 29, 2013, in related U.S. Appl. No. 13/187,874.
United States Patent and Trademark Office, Office Action mailed Aug. 29, 2013, in related U.S. Appl. No. 13/189,114.
United States Patent and Trademark Office, Office Action mailed Sep. 30, 2013, in related U.S. Appl. No. 13/170,044.
United States Patent and Trademark Office, Office Action mailed Jun. 19, 2013, in related U.S. Appl. No. 13/187,890.
Taiwan Intellectual Property Office, Office Action dated Jan. 10, 2014, in related application TW 100143128.
Taiwan Intellectual Property Office, Office Action dated Jan. 10, 2014, in related application TW 100143130.
Taiwan Intellectual Property Office, Office Action dated Jan. 10, 2014, in related application TW 100143133.
Taiwan Intellectual Property Office, Office Action dated Jan. 7, 2014, in related application TW 100140587.
Taiwan Intellectual Property Office, Office Action dated Jan. 6, 2014, in related application TW 100140588.
Taiwan Intellectual Property Office, Office Action dated Feb. 17, 2014, in related application TW 100143160.
Taiwan Intellectual Property Office, Office Action dated Jan. 6, 2014, in related application TW 100140590.
Taiwan Intellectual Property Office, Office Action dated Jan. 17, 2014, in related application TW 100141797.
Taiwan Intellectual Property Office, Office Action dated Jan. 17, 2014, in related application TW 100141802.
United States Patent and Trademark Office, Notice of Allowance mailed Dec. 5, 2013, in related U.S. Appl. No. 13/166,281.
United States Patent and Trademark Office, Notice of Allowance mailed Nov. 8, 2013, in related U.S. Appl. No. 13/166,301.
United States Patent and Trademark Office, Notice of Allowance mailed Jan. 6, 2014, in related U.S. Appl. No. 13/189,096.
United States Patent and Trademark Office, Notice of Allowance mailed Jan. 6, 2014, in related U.S. Appl. No. 13/187,874.
United States Patent and Trademark Office, Office Action mailed Nov. 20, 2013, in related U.S. Appl. No. 13/168,004.
United States Patent and Trademark Office, Office Action mailed Nov. 22, 2013, in related U.S. Appl. No. 13/168,014.
United States Patent and Trademark Office, Final Office Action mailed Feb. 25, 2014, in related U.S. Appl. No. 13/170,021.
United States Patent and Trademark Office, Office Action mailed Jan. 6, 2014, in related U.S. Appl. No. 13/187,266.
United States Patent and Trademark Office, Office Action mailed Jan. 3, 2014, in related U.S. Appl. No. 13/184,906.
United States Patent and Trademark Office, Office Action mailed Jan. 2, 2014, in related U.S. Appl. No. 13/189,114.
United States Patent and Trademark Office, Office Action mailed Dec. 4, 2013, in related U.S. Appl. No. 13/187,890.
United States Patent and Trademark Office, Office Action mailed Jan. 6, 2014, in related U.S. Appl. No. 13/541,487.
United States Patent and Trademark Office, Office Action mailed Dec. 4, 2013, in related U.S. Appl. No. 13/748,525.
United States Patent and Trademark Office, Office Action mailed Jan. 15, 2014, in related U.S. Appl. No. 13/749,480.

(56) References Cited

OTHER PUBLICATIONS

United States Patent and Trademark Office, Office Action mailed Jun. 10, 2014, in related U.S. Appl. No. 13/168,004.
United States Patent and Trademark Office, Office Action mailed Jun. 18, 2014, in related U.S. Appl. No. 13/168,014.
United States Patent and Trademark Office, Office Action mailed Jun. 16, 2014, in related U.S. Appl. No. 13/184,879.
United States Patent and Trademark Office, Office Action mailed Jun. 20, 2014, in related U.S. Appl. No. 13/184,894.
United States Patent and Trademark Office, Office Action mailed Jun. 25, 2014, in related U.S. Appl. No. 13/187,266.
United States Patent and Trademark Office, Office Action mailed Jun. 24, 2014, in related U.S. Appl. No. 13/184,906.
United States Patent and Trademark Office, Office Action mailed Jun. 17, 2014, in related U.S. Appl. No. 13/185,744.
United States Patent and Trademark Office, Office Action mailed Jun. 16, 2014, in related U.S. Appl. No. 13/184,915.
United States Patent and Trademark Office, Office Action mailed Jun. 13, 2014, in related U.S. Appl. No. 13/185,756.
United States Patent and Trademark Office, Office Action mailed Jul. 7, 2014, in related U.S. Appl. No. 13/187,890.
United States Patent and Trademark Office, Office Action mailed Jun. 25, 2014, in related U.S. Appl. No. 13/541,487.
United States Patent and Trademark Office, Office Action mailed Jun. 26, 2014, in related U.S. Appl. No. 13/748,525.
United States Patent and Trademark Office, Office Action mailed Jun. 24, 2014, in related U.S. Appl. No. 13/749,480.
United States Patent and Trademark Office, Notice of Allowance mailed Apr. 25, 2014, in related U.S. Appl. No. 13/166,281.
United States Patent and Trademark Office, Notice of Allowance mailed Jun. 24, 2014, in related U.S. Appl. No. 13/170,021.
United States Patent and Trademark Office, Notice of Allowance mailed May 2, 2014, in related U.S. Appl. No. 13/166,301.
United States Patent and Trademark Office, Notice of Allowance mailed Jun. 18, 2014, in related U.S. Appl. No. 13/189,096.
United States Patent and Trademark Office, Notice of Allowance mailed May 8, 2014, in related U.S. Appl. No. 13/187,874.
United States Patent and Trademark Office, Notice of Allowance mailed Apr. 28, 2014, in related U.S. Appl. No. 13/189,114.
United States Patent and Trademark Office, Notice of Allowance mailed May 22, 2014, in related U.S. Appl. No. 13/170,044.
United States Patent and Trademark Office, Notice of Allowance mailed Oct. 6, 2014, U.S. Appl. No. 13/168,014.
United States Patent and Trademark Office, Notice of Allowance mailed Oct. 6, 2014, U.S. Appl. No. 13/184,906.
United States Patent and Trademark Office, Notice of Allowance mailed Oct. 3, 2014, U.S. Appl. No. 13/187,890.
United States Patent and Trademark Office, Notice of Allowance mailed Oct. 7, 2014, U.S. Appl. No. 13/541,487.
United States Patent and Trademark Office, Notice of Allowance mailed Oct. 6, 2014, U.S. Appl. No. 13/748,525.
United States Patent and Trademark Office, Notice of Allowance mailed Oct. 6, 2014, U.S. Appl. No. 13/749,480.
United States Patent and Trademark Office, Office Action mailed Sep. 11, 2014, U.S. Appl. No. 13/545,885.
United States Patent and Trademark Office, Office Action mailed Sep. 11, 2014, U.S. Appl. No. 13/465,906.
United States Patent and Trademark Office, Office Action mailed Sep. 26, 2014, U.S. Appl. No. 13/544,881.
United States Patent and Trademark Office, Office Action mailed Sep. 3, 2014, U.S. Appl. No. 13/486,883.
United States Patent and Trademark Office, Office Action mailed Nov. 13, 2014, U.S. Appl. No. 13/168,004.
United States Patent and Trademark Office, Office Action mailed Nov. 17, 2014, U.S. Appl. No. 13/187,266.
United States Patent and Trademark Office, Office Action mailed Dec. 11, 2014, U.S. Appl. No. 13/184,879.
United States Patent and Trademark Office, Office Action mailed Dec. 31, 2014, U.S. Appl. No. 13/185,756.

* cited by examiner

BATTERY HEATING CIRCUITS AND METHODS WITH RESONANCE COMPONENTS IN SERIES USING VOLTAGE INVERSION BASED ON PREDETERMINED CONDITIONS

1. CROSS-REFERENCE TO RELATED APPLICATIONS

This application claims priority to Chinese Patent Application No. 201010245288.0, filed Jul. 30, 2010, Chinese Patent Application No. 201010274785.3, filed Aug. 30, 2010, and Chinese Patent Application No. 201110137264.8, filed May 23, 2011, all these three applications being incorporated by reference herein for all purposes.

Additionally, this application is related to International Application Publication No. WO2010/145439A1 and Chinese Application Publication No. CN102055042A, both these two applications being incorporated by reference herein for all purposes.

2. BACKGROUND OF THE INVENTION

The present invention pertains to electric and electronic field, in particular related to a battery heating circuit.

Considering cars need to run under complex road conditions and environmental conditions or some electronic devices are used under harsh environmental conditions, the battery, which serves as the power supply unit for electric-motor cars or electronic devices, need to be adaptive to these complex conditions. In addition, besides these conditions, the service life and charge/discharge cycle performance of the battery need to be taken into consideration; especially, when electric-motor cars or electronic devices are used in low temperature environments, the battery needs to have outstanding low-temperature charge/discharge performance and higher input/output power performance.

Usually, under low temperature conditions, the resistance of the battery will increase, and so will the polarization; therefore, the capacity of the battery will be reduced.

To keep the capacity of the battery and improve the charge/discharge performance of the battery under low temperature conditions, some embodiments of the present invention provide a battery heating circuit.

3. BRIEF SUMMARY OF THE INVENTION

The objective of certain embodiments of the present invention is to provide a battery heating circuit, in order to solve the problem of decreased capacity of the battery caused by increased resistance and polarization of the battery under low temperature conditions.

The battery heating circuit provided in certain embodiments of the present invention comprises a switch unit, a switching control module, a damping component, an energy storage circuit, and an energy superposition unit, the energy storage circuit is configured to connected with the battery to form a loop, and comprises a current storage component and a charge storage component; the damping component R1, the switch unit, the current storage component L1, and the charge storage component C1 are connected in series; the switching control module is connected with the switch unit, and is configured to control ON/OFF of the switch unit, so as to control the energy to flowing between the battery and the energy storage circuit; the energy superposition unit is connected with the energy storage circuit, and configured to superpose the energy in the energy storage circuit with the energy in the battery after the switch unit switches on and then switches off; the switching control module is configured to control the switch unit to switch off after the first positive half cycle of current flow through the switch unit after the switch unit switches on, and the voltage applied to the switch unit at the time the switch unit switches off is lower than the voltage rating of the switch unit.

The heating circuit provided in certain embodiments of the present invention can improve the charge/discharge performance of the battery; in addition, since the energy storage circuit is connected with the battery in series in the heating circuit, safety problem related with failures and short circuit caused by failures of the switch unit can be avoided when the battery is heated due to the existence of the charge storage component connected in series, and therefore the battery can be protected effectively.

In addition, owing to the existence of the current storage component in the loop, switching off the switch unit when there is current flow in the loop will cause abrupt current drop to zero and therefore induces high induced voltage on the current storage component in the loop, which may cause damage to other circuit components in the loop (e.g., the switch unit). In the heating circuit provided in certain embodiments of the present invention, since the switching-off opportunity of the switch unit is chosen according to the voltage rating of the switch unit, high induced voltage on the current storage component in the loop and the resultant damage to the switch unit can be prevented, and therefore the heating circuit is safer, and the adverse effect to the entire circuit can be reduced.

In addition, an energy superposition unit is provided in the heating circuit in certain embodiments of the present invention, and the energy superposition unit can superpose the energy in the energy storage circuit with the energy in the battery after the switch unit switches on and then switches off; thus, the discharging current in the heating loop will be increased when the switch unit is controlled to switch on at the next time, and therefore the working efficiency of the heating circuit is improved.

Other characteristics and advantages of the present invention will be further described in detail in the following section for embodiments.

4. BRIEF DESCRIPTION OF THE DRAWINGS

The accompanying drawings, as a part of this description, are provided here to facilitate further understanding of the present invention, and are used in conjunction with the following embodiments to explain the present invention, but shall not be comprehended as constituting any limitation on the present invention. In the figures.

5. DETAILED DESCRIPTION OF THE INVENTION

Figure 1:
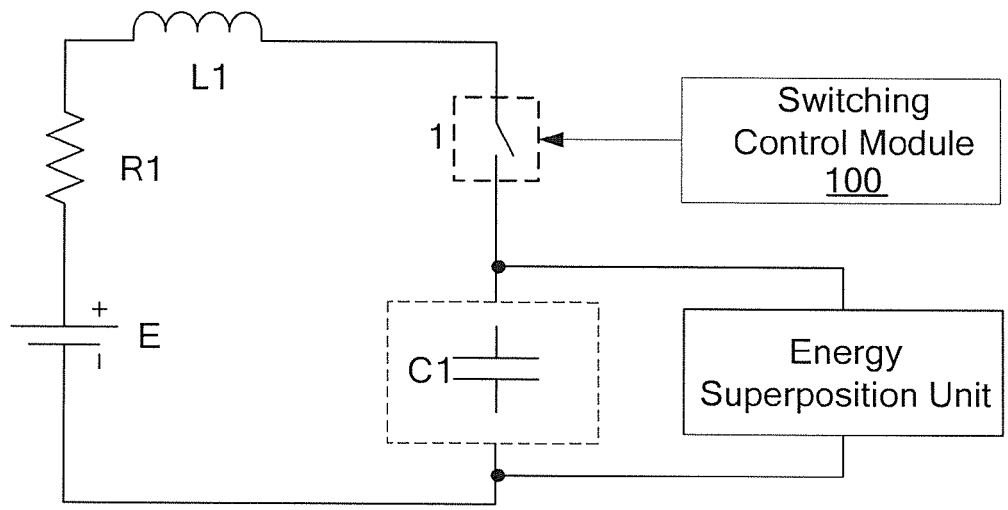
FIG. 1 is a schematic diagram of the battery heating circuit provided in one embodiment of the present invention.

Certain embodiments of the present invention are described in detail below, with reference to the accompanying drawings. It should be appreciated that the embodiments described here are only provided to describe and explain the present invention, but shall not be deemed as constituting any limitation on the present invention.

It is noted that, unless otherwise specified, when mentioned hereafter in this description, the term "switching control module" may refer to any controller that can output control commands (e.g., pulse waveforms) under preset conditions or at preset times and thereby control the switch unit connected to it to switch on or switch off accordingly, according to some embodiments. For example, the switching control module can be a PLC. Unless otherwise specified, when mentioned hereafter in this description, the term "switch" may refer to a switch that enables ON/OFF control by using electrical signals or enables ON/OFF control on the basis of the characteristics of the component according to certain embodiments. For example, the switch can be either a one-way switch (e.g., a switch composed of a two-way switch and a diode connected in series, which can be conductive in one direction) or a two-way switch (e.g., a Metal Oxide Semiconductor Field Effect Transistor (MOSFET) or an IGBT with an anti-parallel freewheeling diode). Unless otherwise specified, when mentioned hereafter in this description, the term "two-way switch" may refer to a switch that can be conductive in two directions, which can enable ON/OFF control by using electrical signals or enable ON/OFF control on the basis of the characteristics of the component according to some embodiments. For example, the two-way switch can be a MOSFET or an IGBT with an anti-parallel freewheeling diode. Unless otherwise specified, when mentioned hereafter in this description, the term "one-way semiconductor component" may refer to a semiconductor component that can be conductive in one direction, such as a diode, according to certain embodiments. Unless otherwise specified, when mentioned hereafter in this description, the term "charge storage component" may refer to any device that can enable charge storage, such as a capacitor, according to some embodiments. Unless otherwise specified, when mentioned hereafter in this description, the term "current storage component" may refer to any device that can store current, such as an inductor, according to certain embodiments. Unless otherwise specified, when mentioned hereafter in this description, the term "forward direction" may refer to the direction in which the energy flows from the battery to the energy storage circuit, and the term "reverse direction" may refer to the direction in which the energy flows from the energy storage circuit to the battery, according to some embodiments. Unless otherwise specified, when mentioned hereafter in this description, the term "battery" may comprise primary battery (e.g., dry battery or alkaline battery, etc.) and secondary battery (e.g., lithium-ion battery, nickel-cadmium battery, nickel-hydrogen battery, or lead-acid battery, etc.), according to certain embodiments. Unless otherwise specified, when mentioned hereafter in this description, the term "damping component" may refer to any device that inhibits current flow and thereby enables energy consumption, such as a resistor, etc., according to some embodiments. Unless otherwise specified, when mentioned hereafter in this description, the term "main loop" may refer to a loop composed of battery, damping component, switch unit and energy storage circuit connected in series according to certain embodiments.

It should be noted specially that, considering different types of batteries have different characteristics, in some embodiments of the present invention, "battery" may refer to an ideal battery that does not have internal parasitic resistance and parasitic inductance or has very low internal parasitic resistance and parasitic inductance, or may refer to a battery pack that has internal parasitic resistance and parasitic inductance; therefore, those skilled in the art should appreciate that if the battery is an ideal battery that does not have internal parasitic resistance and parasitic inductance or has very low internal parasitic resistance and parasitic inductance, the damping component R1 may refer to a damping component external to the battery and the current storage component L1 may refer to a current storage component external to the battery; if the battery is a battery pack that has internal parasitic resistance and parasitic inductance, the damping component R1 may refer to a damping component external to the battery or refer to the parasitic resistance in the battery pack, and the current storage component L1 may refer to a current storage component external to the battery or refer to the parasitic inductance in the battery pack, according to certain embodiments.

To ensure the normal service life of the battery, according to some embodiments, the battery can be heated under low temperature condition, which is to say, when the heating condition is met, the heating circuit is controlled to start heating for the battery; when the heating stop condition is met, the heating circuit is controlled to stop heating, according to certain embodiments.

In the actual application of battery, the battery heating condition and heating stop condition can be set according to the actual ambient conditions, to ensure normal charge/discharge performance of the battery, according to some embodiments.

To heat up the battery E in a low temperature environment, one embodiment of the present invention provides a heating circuit for battery E, as shown in FIG. 1; the heating circuit comprises a switch unit 1, a switching control module 100, a damping component R1, an energy storage circuit, and an energy superposition unit, the energy storage circuit is configured to connect with the battery to form a loop, and comprises a current storage component L1 and a charge storage component C1; the damping component R1, the switch unit 1, the current storage component L1, and the charge storage component C1 are connected in series; the switching control module 100 is connected with the switch unit 1, and is configured to control ON/OFF of the switch unit 1, so as to control the energy flowing between the battery and the energy storage circuit; the energy superposition unit is connected with the energy storage circuit, and is configured to superpose the energy in the energy storage circuit with the energy in the battery when the switch unit 1 switches on and then switches off; the switching control module 100 is also configured to control the switch unit 1 to switch off after the first positive half cycle of the current flow through the switch unit 1 after the switch unit 1 switches on, and the voltage applied to the switch unit 1 when the switch unit 1 switches off is lower than the voltage rating of the switch unit 1.

With the technical scheme of certain embodiments of the present invention, when the heating condition is met, the switching control module 100 controls the switch unit 1 to switch on, and thus the battery E is connected with the energy storage circuit in series to form a loop, and can discharge through the loop (i.e., charge the charge storage component C1); when the current in the loop reaches zero in normal direction after the peak current, the charge storage component C1 begins to discharge through the loop, i.e., charge the battery E; in the charge/discharge process of the battery E, the current in the loop passes through the damping component R1 in both normal direction and reversed direction, and thus the battery E is heated up by the heat generated in the damping component R1; when the condition for heating stop is met, the switching control module 100 can control the switch unit 1 to switch off, so that the heating circuit stops heating.

Figure 2:
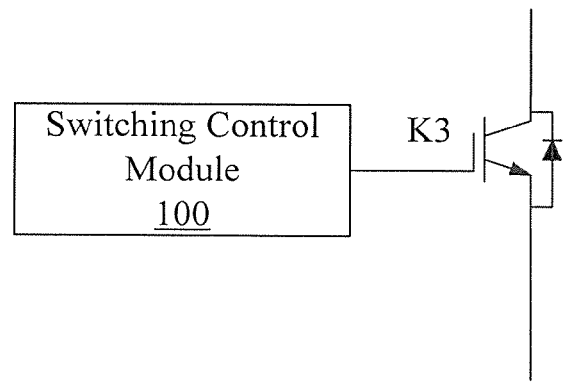
FIG. 2 is a schematic diagram of one embodiment of the switch unit shown in FIG. 1.

To achieve to-and-fro energy flow between the battery E and the energy storage circuit, in one embodiment of the present invention, the switch unit 1 is a two-way switch K3, as shown in FIG. 2. The switching control module 100 controls ON/OFF of the two-way switch K3; when the battery E is to be heat up, the two-way switch K3 can be controlled to switch on; if heating is to be paused or is not needed, the two-way switch K3 can be controlled to switch off.

Employing a separate two-way switch K3 to implement the switch unit 1 can simplify the circuit, reduce system footprint, and simplify the implementation; however, to implement cut-off of reverse current, the following embodiment of the switch unit 1 is further provided in the present invention.

Preferably, the switch unit 1 comprises a first one-way branch configured to enable energy flow from the battery E to the energy storage circuit, and a second one-way branch configured to enable energy flow from the energy storage circuit to the battery E; wherein: the switching control module 100 is connected to the first one-way branch and the second one-way branch respectively, and is configured to control ON/OFF the switch unit 1 by controlling ON/OFF of the connected branches.

When the battery is to be heated, both the first one-way branch and the second one-way branch can be controlled to switch on; when heating is to be paused, either or both of the first one-way branch and the second one-way branch can be controlled to switch off; when heating is not needed, both of the first one-way branch and the second one-way branch can be controlled to switch off. Preferably, both of the first one-way branch and the second one-way branch are subject to the control of the switching control module 100; thus, energy flow cut-off in normal direction and reversed direction can be implemented flexibly.

Figure 3:
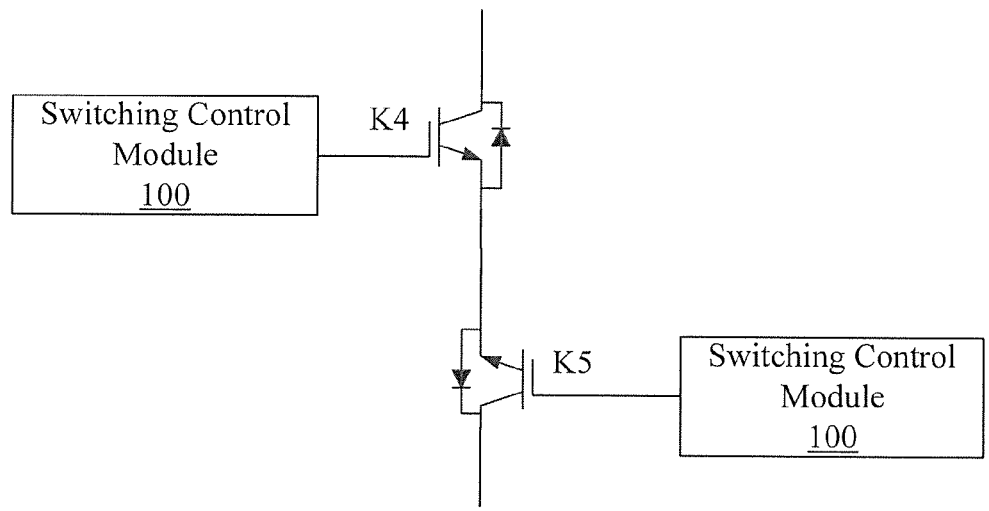
FIG. 3 is a schematic diagram of one embodiment of the switch unit shown in FIG. 1.

In another embodiment of the switch unit 1, as shown in FIG. 3, the switch unit 1 comprises a two-way switch K4 and a two-way switch K5, wherein: the two-way switch K4 and two-way switch K5 are connected in series opposite to each other, to form the first one-way branch and the second one-way branch; the switching control module 100 is connected with the two-way switch K4 and the two-way switch K5 respectively, to control ON/OFF of the first one-way branch and the second one-way branch by controlling ON/OFF of the two-way switch K4 and two-way switch K5.

When the battery E is to be heated, the two-way switches K4 and K5 can be controlled to switch on; when heating is to be paused, either or both of the two-way switch K4 and the two-way switch K5 can be controlled to switch off; when heating is not needed, both of the two-way switch K4 and the two-way switch K5 can be controlled to switch off. In such an implementation of switch unit 1, the first one-way branch and the second one-way branch can be controlled separately to switch on and off, and therefore energy flow in normal direction and reversed direction in the circuit can be implemented flexibly.

Figure 4:
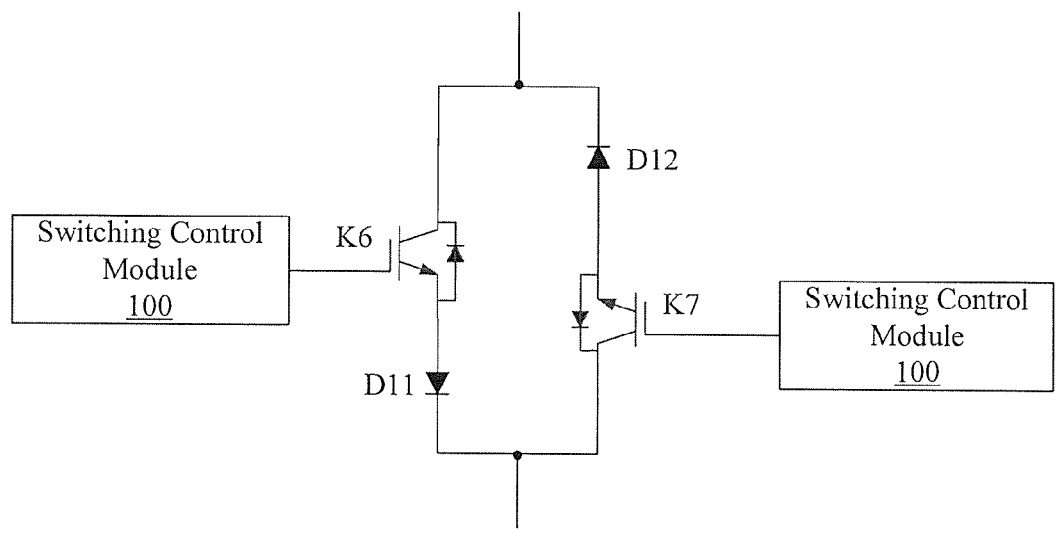
FIG. 4 is a schematic diagram of one embodiment of the switch unit shown in FIG. 1.

In another embodiment of switch unit 1, as shown in FIG. 4, the switch unit 1 comprises a switch K6, a one-way semi-conductor component D11, a switch K7, and a one-way semi-conductor component D12, wherein: the switch K6 and the one-way semiconductor component D11 are connected in series with each other to form the first one-way branch; the switch K7 and the one-way semiconductor component D12 are connected in series with each other to form the second one-way branch; the switching control module 100 is connected with the switch K6 and the switch K7, to control ON/OFF of the first one-way branch and the second one-way branch by controlling ON/OFF of the switch K6 and the switch K7. In the switch unit 1 shown in FIG. 4, since switches (i.e., the switch K6 and the switch K7) exist in both one-way branches, energy flow cut-off function in normal direction and reversed direction is implemented.

Figure 5:
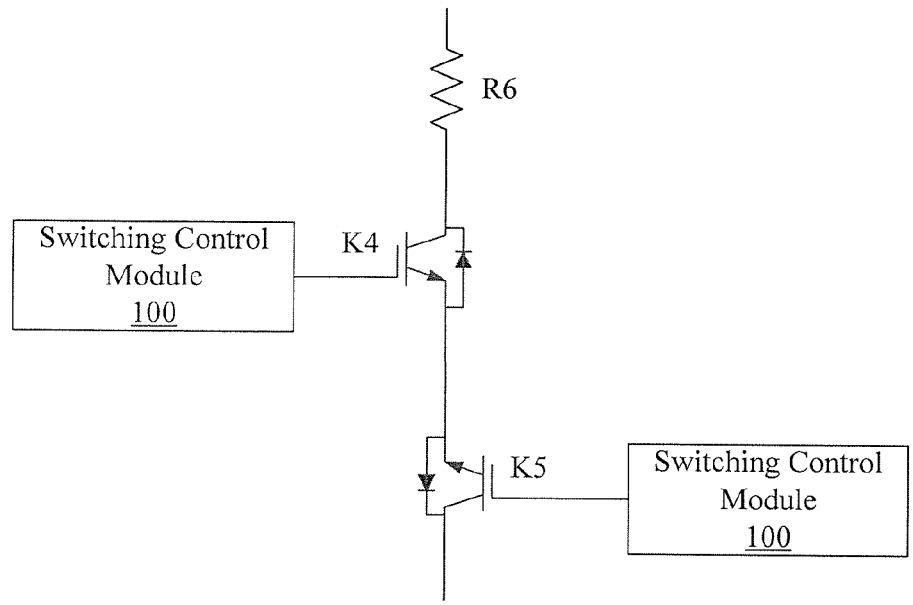
FIG. 5 is a schematic diagram of one embodiment of the switch unit shown in FIG. 1.
Figure 6:
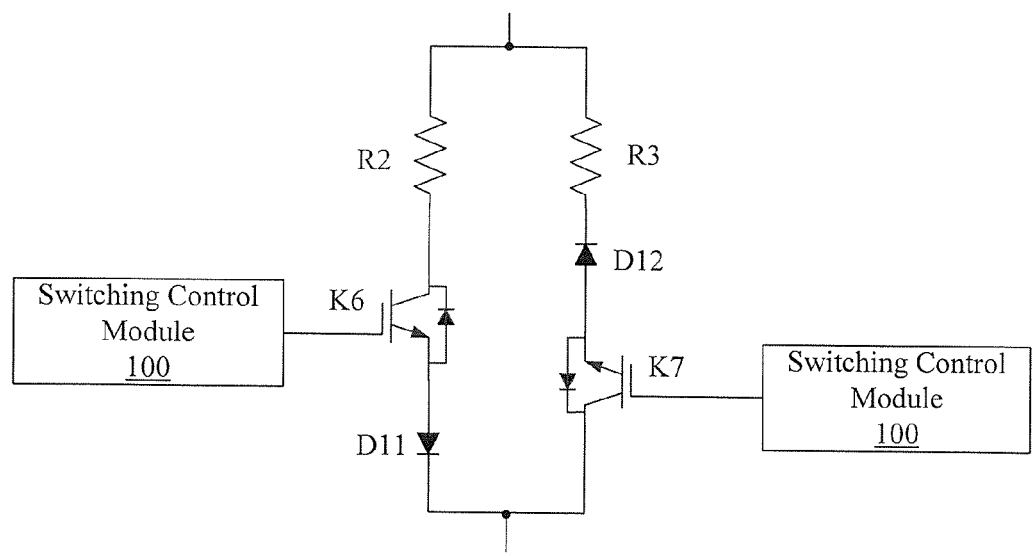
FIG. 6 is a schematic diagram of one embodiment of the switch unit shown in FIG. 1.

Preferably, the switch unit 1 can further comprise a resistor, which is connected in series with the first one-way branch and/or second one-way branch and configured to reduce the current in the heating circuit for the battery E and avoid damage to the battery E resulted from over-current in the circuit. For example, a resistor R6 connected in series with the two-way switch K4 and the two-way switch K5 can be added in the switch unit 1 shown in FIG. 3, to obtain another implementation of the switch unit 1, as shown in FIG. 5. FIG. 6 shows one embodiment of the switch unit 1, which is obtained by connecting the resistor R2 and the resistor R3 in series in the two one-way branches in the switch unit 1 shown in FIG. 4, respectively.

Owing to the existence of the current storage component L1 in the loop, switching off the switch unit 1 when there is current flow in the loop will cause abrupt current drop to zero and therefore induces high induced voltage on the current storage component in L1 the loop, which may cause damage to other circuit components in the loop (e.g., the switch unit 1). To improve safety of the heating circuit, in the technical scheme of certain embodiments of the present invention, the switching control module 100 can choose the switching-off opportunity of the switch unit 1, so as to enable the voltage applied to the switch unit 1 lower than the voltage rating of the switch unit 1 at the time the switch unit 1 switches off. The switching-off opportunity of the switch unit 1 can be determined according to the voltage rating of the switch unit 1, so as to prevent high induced voltage on the current storage component L1 and the resultant damage to the switch unit 1; therefore, the heating circuit is safer, and the adverse effect to the entire circuit can be reduced.

Wherein: for example, the switching-off opportunity can be the time interval from the time the current flow through the switch unit 1 reaches degree 30 before zero after the peak value in the negative half cycle to the time the current flow reaches degree 30 after zero before the peak value in the next positive half cycle, and the switch unit 1 can switch off at any time within the said time interval. Of course, the present invention is not limited to that. The specific time interval should be determined according to the voltage rating of the switch unit 1; for example, the time interval can be from the time the current flow through the switch unit 1 reaches degree 60 before zero after the peak value in the negative half cycle to the time the current flow reaches degree 60 after zero before the peak value in the next positive half cycle, depending on the voltage rating of the switch unit 1.

In the cyclic charge/discharge process of the battery E, since the energy will not be charged back completely into the battery E when the battery E is charged in reversed direction, the energy discharged from the battery E in the next discharge cycle in positive direction will be reduced, and therefore the heating efficiency of the heating circuit will be degraded. Therefore, preferably, the switching control module 100 is configured to control the switch unit 1 to switch off when the current flow through the switch unit 1 reaches zero after the peak value in the negative half cycle after the switch unit 1 switches on, so as to improve the heating efficiency of the heating circuit, and minimize the induced voltage on the current storage component L1, and thereby minimize the voltage applied to the switch unit 1 when the switch unit 1 switches off, in order to prevent the damage of high induced voltage to the switch unit 1.

Figure 7:
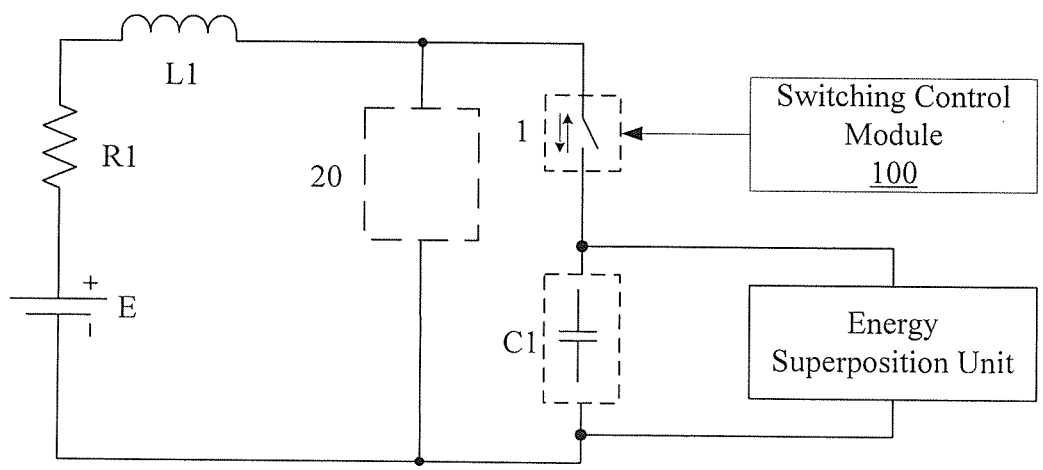
FIG. 7 is a schematic diagram of one embodiment of the battery heating circuit provided in the present invention.

Preferably, as shown in FIG. 7, the heating circuit further comprises a freewheeling circuit 20, which is configured to form a serial loop with the battery E and the current storage component L1 to sustain current flow in the battery E after the switch unit 1 switches on and then switches off. Thus, after the switch unit 1 switches off, the current flow can be sustained by controlling the freewheeling circuit 20 to operate, so as to protect other circuit components (e.g., switch unit 1) in the circuit, and ensure safety of the heating circuit. The utilization of the freewheeling circuit widens the range of switching-off opportunity of the switch unit 1.

Figure 8:
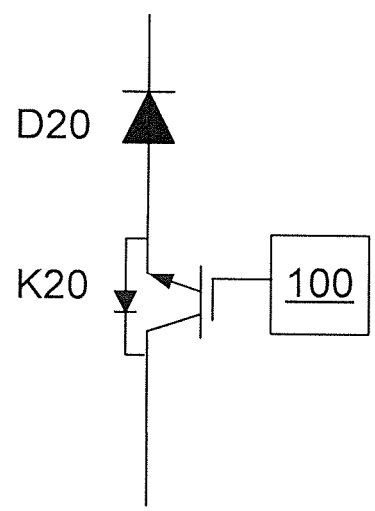
FIG. 8 is a schematic diagram of one embodiment of the freewheeling circuit shown in FIG. 7.

In one embodiment of the present invention, the switching control module 100 is configured to control the switch unit 1 to switch off before the current flow through the switch unit 1 reaches zero after the peak value in the negative half cycle after the switch unit 1 switches on. As shown in FIG. 8, the freewheeling circuit 20 can comprises a switch K20 and a one-way semiconductor component D2 connected in series with each other; the switching control module 100 is connected with the switch K20, and is configured to control the switch K20 to switch on after the switch unit 1 switches on and then switches off, and control the switch K20 to switch off after the current flow to the battery E reaches a preset value of current (e.g., zero). The freewheeling circuit 20 can be connected in parallel between the ends of the battery E; or, one end of the freewheeling circuit 20 can be connected between the switch K7 and the one-way semiconductor component D12 in the second one-way branch of the switch unit 1, and the other end of the freewheeling circuit 20 can be connected to the battery E, as shown in FIG. 4.

The preset value of current is a value that will not make the voltage applied to the switch unit 1 higher than or equal to the voltage rating of the switch unit 1 at the time the switch unit 1 switches off, and can be set according to the voltage rating of the switch unit 1.

Figure 9:
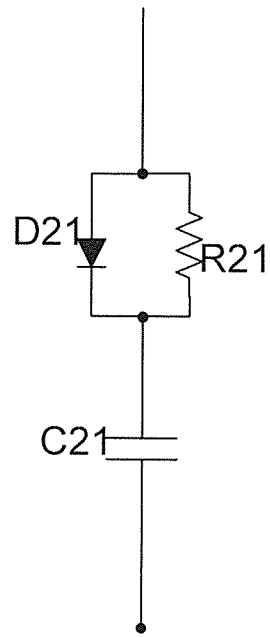
FIG. 9 is a schematic diagram of another embodiment of the freewheeling circuit shown in FIG. 7.

In another embodiment of the present invention, the switching control module 100 is configured to control the switch unit 1 to switch off after the current flow through the switch unit 1 reaches zero before the peak value in the positive half cycle of the switch unit 1 after the switch unit 1 switches on. As shown in FIG. 9, the freewheeling circuit 20 can comprise a one-way semiconductor component D21, a damping component R21, and a charge storage component C21, the one-way semiconductor component D21 and the damping component R21 are connected in parallel with each other, and then connected in series with the charge storage component C21; after the switch unit 1 switches on and then switches off, the current storage component L1 can sustain the current flow via the one-way semiconductor component D21 and the charge storage component C21; the damping component R21 is configured to release the energy stored in the charge storage component C21. The freewheeling circuit 20 can be connected in parallel between the ends of the battery E; or, one end of the freewheeling circuit 20 can be connected between the switch K6 and the one-way semiconductor component D11 in the first one-way branch of the switch unit 1, and the other end of the freewheeling circuit 20 can be connected to the battery E, as shown in FIG. 4.

The energy superposition unit is connected with the energy storage circuit, and is configured to superpose the energy in the energy storage circuit with the energy in the battery E after the switch unit 1 switches on and then switches off, so that the discharging current in the heating circuit will be increased when the switch unit 1 is controlled to switch on at the next time, and thereby the working efficiency of the heating circuit is improved.

Figure 10:
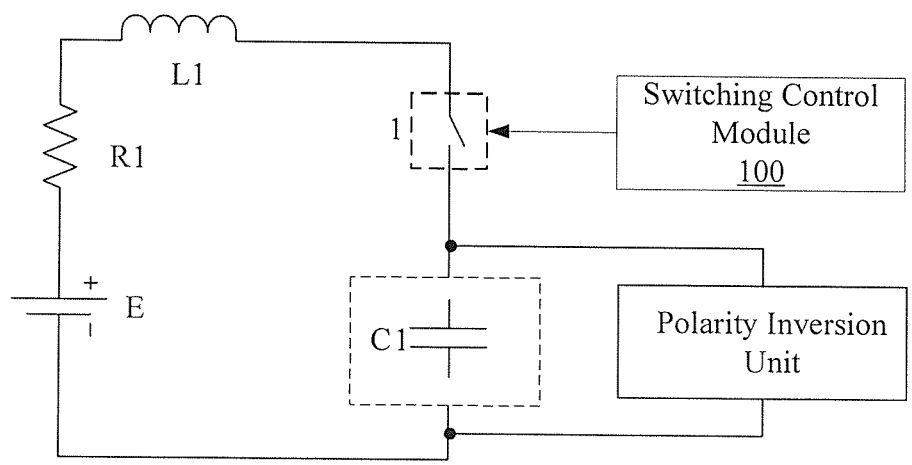
FIG. 10 is a schematic diagram of one embodiment of the energy superposition unit shown in FIG. 1.

In one embodiment of the present invention, as shown in FIG. 10, the energy superposition unit comprises a polarity inversion unit 102, which is connected with the energy storage circuit, and is configured to invert the voltage polarity of the charge storage component C1 after the switch unit 1 switches on and then switches off; since the voltage of the charge storage component C1 can be superposed in series with the voltage of the battery E after polarity inversion, the discharging current in the heating circuit will be increased when the switch unit 1 switches on at the next time.

Figure 11:
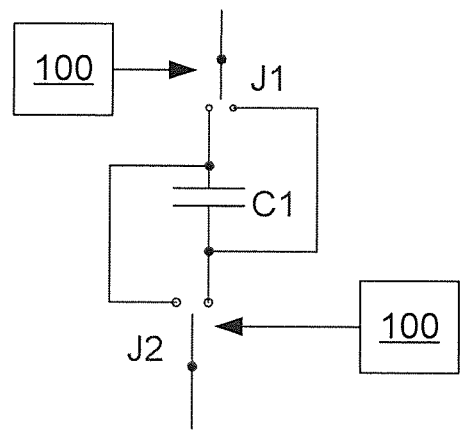
FIG. 11 is a schematic diagram of one embodiment of the polarity inversion unit shown in FIG. 10.

In one embodiment of the polarity inversion unit 102, as shown in FIG. 11, the polarity inversion unit 102 comprises a single-pole double-throw switch J1 and a single-pole double-throw switch J2 located on the two ends of the charge storage component C1 respectively; the input wires of the single-pole double-throw switch J1 are connected in the energy storage circuit, the first output wire of the single-pole double-throw switch J1 is connected with the first pole plate of the charge storage component C1, and the second output wire of the single-pole double-throw switch J1 is connected with the second pole plate of the charge storage component C1; the input wires of the single-pole double-throw switch J2 are connected in the energy storage circuit, the first output wire of the single-pole double-throw switch J2 is connected with the second pole plate of the charge storage component C1, and the second output wire of the single-pole double-throw switch J2 is connected with the first pole plate of the charge storage component C1; the switching control module 100 is also connected with the single-pole double-throw switch J1 and single-pole double-throw switch J2 respectively, and is configured to invert the voltage polarity of the charge storage component C1 by altering the connection relationships between the respective input wires and output wires of the single-pole double-throw switch J1 and the single-pole double-throw switch J2.

According to this embodiment, the connection relationships between the respective input wires and output wires of the single-pole double-throw switch J1 and single-pole double-throw switch J2 can be set in advance, so that the input wires of the single-pole double-throw switch J1 are connected with the first output wire of the switch unit K1 and the input wires of the single-pole double-throw switch J2 are connected with the first output wire of the switch unit K1 when the switch unit K1 switches on; the input wires of the single-pole double-throw switch J1 are switched to connect with the second output wire of the switch unit K1 and the input wires of the single-pole double-throw switch J2 are switched to connect with the second output wire of the switch unit K1 under control of the switching control module 100 when the switch unit K1 switches off, and thereby the voltage polarity of the charge storage component C1 is inverted.

Figure 12:
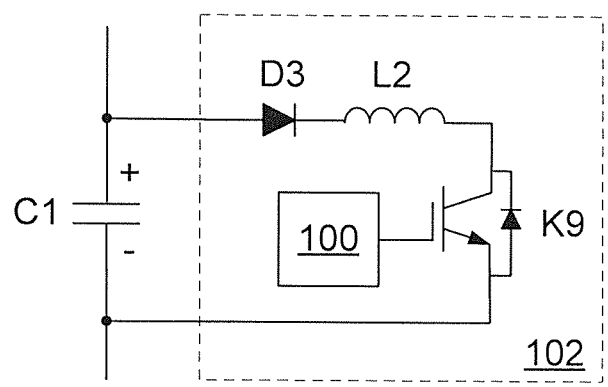
FIG. 12 is a schematic diagram of one embodiment of the polarity inversion unit shown in FIG. 10.

As another embodiment of the polarity inversion unit 102, as shown in FIG. 12, the polarity inversion unit 102 comprises a one-way semiconductor component D3, a current storage component L2, and a switch K9; the charge storage component C1, current storage component L2, and switch K9 are connected sequentially in series to form a loop; the one-way semiconductor component D3 is connected in series between the charge storage component C1 and the current storage component L2 or between the current storage component L2 and the switch K9; the switching control module 100 is also connected with the switch K9, and is configured to invert the voltage polarity of the charge storage component C1 by controlling the switch K9 to switch on.

According to the above embodiment, when the switch unit 1 switches off, the switch K9 can be controlled to switch on by the switching control module 100, and thereby the charge storage component C1, one-way semiconductor component D3, current storage component L2, and switch K9 form a LC oscillation loop, and the charge storage component C1 discharges through the current storage component L2, thus, the voltage polarity of the charge storage component C1 will be inverted when the current flowing through the current storage component L2 reaches zero after the current in the oscillation circuit flows through the positive half cycle.

Figure 13:
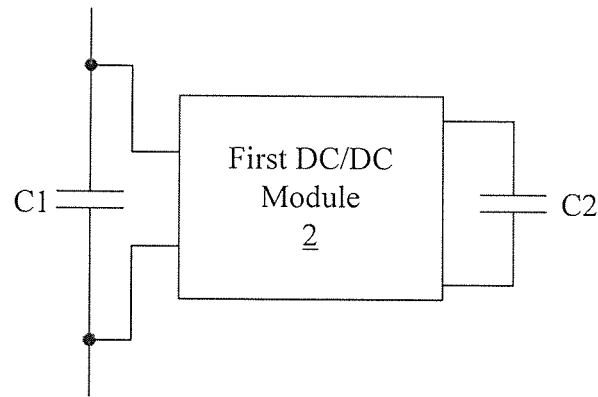
FIG. 13 is a schematic diagram of one embodiment of the polarity inversion unit shown in FIG. 10.

As yet another embodiment of the polarity inversion unit 102, as shown in FIG. 13, the polarity inversion unit 102 comprises a first DC-DC module 2 and a charge storage component C2; the first DC-DC module 2 is connected with the charge storage component C1 and the charge storage component C2 respectively; the switching control module 100 is also connected with the first DC-DC module 2, and is configured to transfer the energy in the charge storage component C1 to the charge storage component C2 by controlling the operation of the first DC-DC module 2, and then transfer the energy in the charge storage component C2 back to the charge storage component C1, so as to invert the voltage polarity of the charge storage component C1.

The first DC-DC module 2 is a DC-DC (direct current to direct current) conversion circuit for voltage polarity inversion commonly used in the field. Certain embodiments of the present invention do not impose any limitation to the specific circuit structure of the first DC-DC module 2, as long as the module can accomplish voltage polarity inversion of the charge storage component C1. Those skilled in the art can add, substitute, or delete the components in the circuit as needed.

Figure 14:
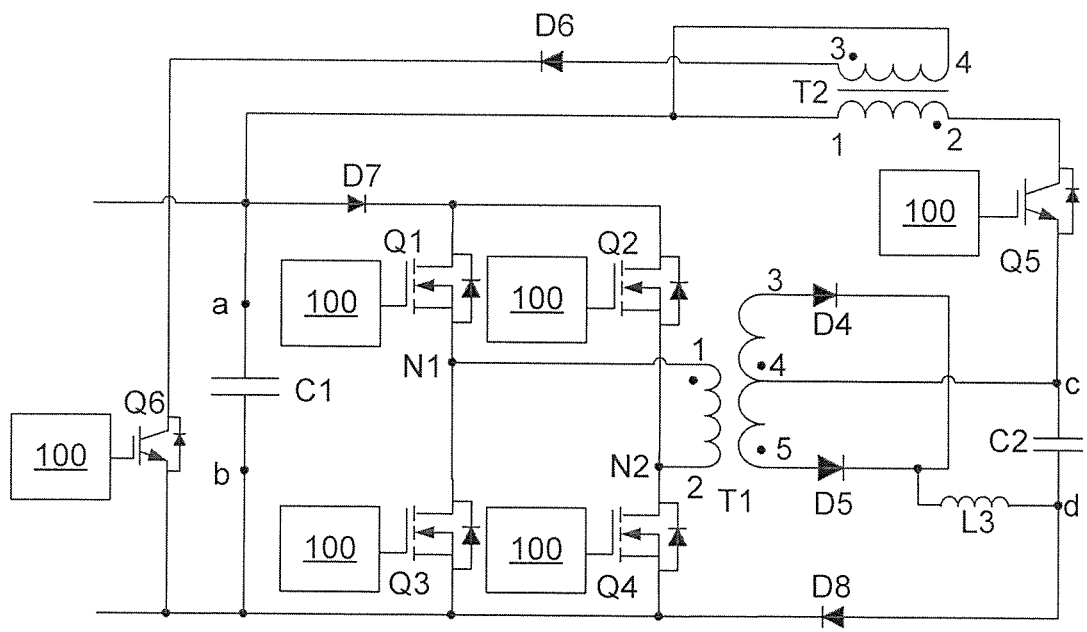
FIG. 14 is a schematic diagram of one embodiment of the first DC-DC module shown in FIG. 13.

FIG. 14 shows one embodiment of the first DC-DC module 2 provided in the present invention. As shown in FIG. 14, the first DC-DC module 2 comprises: a two-way switch Q1, a two-way switch Q2, a two-way switch Q3, a two-way switch Q4, a first transformer T1, a one-way semiconductor component D4, a one-way semiconductor component D5, a current storage component L3, a two-way switch Q5, a two-way switch Q6, a second transformer T2, a one-way semiconductor component D6, a one-way semiconductor component D7, and a one-way semiconductor component D8.

In the embodiment, the two-way switch Q1, two-way switch Q2, two-way switch Q3, and two-way switch Q4 are MOSFETs, and the two-way switch Q5 and two-way switch Q6 are IGBTs.

The Pin 1, 4, and 5 of the first transformer T1 are dotted terminals, and the pin 2 and 3 of the second transformer T2 are dotted terminals.

Wherein: the positive electrode of the one-way semiconductor component D7 is connected with the end 'a' of the charge storage component C1, and the negative electrode of the one-way semiconductor component D7 is connected with the drain electrodes of the two-way switch Q1 and two-way switch Q2, respectively; the source electrode of the two-way switch Q1 is connected with the drain electrode of the two-way switch Q3, and the source electrode of the two-way switch Q2 is connected with the drain electrode of the two-way switch Q4; the source electrodes of the two-way switch Q3 and two-way switch Q4 are connected with the end 'b' of the charge storage component C1 respectively. Thus, a full-bridge circuit is formed, here, the voltage polarity of end 'a' of the charge storage component C1 is positive, while the voltage polarity of end 'b' of the charge storage component C1 is negative.

In the full-bridge circuit, the two-way switch Q1, two-way switch Q2 constitute the upper bridge arm, while the two-way switch Q3 and two-way switch Q4 constitute the lower bridge arm. The full-bridge circuit is connected with the charge storage component C2 via the first transformer T1; the pin 1 of the first transformer T1 is connected with the first node N1, the pin 2 of the first transformer T1 is connected with the second node N2, the pin 3 and pin 5 of the first transformer T1 are connected to the positive electrode of the one-way semiconductor component D4 and the positive electrode of the one-way semiconductor component D5 respectively; the negative electrode of one-way semiconductor component D4 and the negative electrode of one-way semiconductor component D5 are connected with one end of the current storage component L3, and the other end of the current storage component L3 is connected with the end 'd' of the charge storage component C2; the pin 4 of the transformer T1 is connected with the end 'c' of the charge storage component C2, the positive electrode of the one-way semiconductor component D8 is connected with the end 'd' of the charge storage component C2, and the negative electrode of the one-way semiconductor component D8 is connected with the end 'b' of the charge storage component C1; here, the voltage polarity of end 'c' of the charge storage component C2 is negative, while the voltage polarity of end 'd' of the charge storage component C2 is positive.

Wherein: the end 'c' of the charge storage component C2 is connected with the emitter electrode of the two-way switch Q5, the collector electrode of the two-way switch Q5 is connected with the pin 2 of the transformer T2, the pin 1 of the transformer T2 is connected with end 'a' of the charge storage component C1, the pin 4 of the transformer T2 is connected with end 'a' of the charge storage component C1, the pin 3 of the transformer T2 is connected with the positive electrode of the one-way semiconductor component D6, the negative electrode of the one-way semiconductor component D6 is connected with the collector electrode of the two-way switch Q6, and the emitter electrode of the two-way switch Q6 is connected with the end 'b' of the charge storage component C2.

Wherein: the two-way switch Q1, two-way switch Q2, two-way switch Q3, two-way switch Q4, two-way switch Q5, and two-way switch Q6 are controlled by the switching control module 100 respectively to switch on and switch off.

Hereafter the working process of the first DC-DC module 2 will be described:

1. After the switch unit 1 switches off, the switching control module 100 controls the two-way switch Q5 and two-way switch Q6 to switch off, and controls the two-way switch Q1 and two-way switch Q4 to switch on at the same time to form phase A; controls the two-way switch Q2 and two-way switch Q3 to switch on at the same time to form phase B. Thus, by controlling the phase A and phase B to switch on alternately, a full-bridge circuit is formed;

2. When the full-bridge circuit operates, the energy in the charge storage component C1 is transferred through the first transformer T1, one-way semiconductor component D4, one-way semiconductor component D5, and current storage component L3 to the charge storage component C2; now, the voltage polarity of end 'c' of the charge storage component C2 is negative, while the voltage polarity of end 'd' of the charge storage component C2 is positive.

3. The switching control module 100 controls the two-way switch Q5 to switch on, and therefore a path from the charge storage component C1 to the charge storage component C2 is formed via the second transformer T2 and the one-way semiconductor component D8, thus, the energy in the charge storage component C2 is transferred back to the charge storage component C1, wherein: some energy will be stored in the second transformer T2, Now, the switching control module 100 controls the two-way switch Q5 to switch off and controls the two-way switch Q6 to switch on, and therefore the energy stored in the second transformer T2 is transferred to the charge storage component C1 by the second transformer T2 and the one-way semiconductor component D6; now, the voltage polarity of the charge storage component C1 is inverted such that end 'a' is negative and end 'b' is positive. Thus, the purpose of inverting the voltage polarity of the charge storage component C1 is attained.

In one embodiment of the present invention, the working efficiency of the heating circuit can be improved by superposing the energy in the charge storage component C1 with the energy in the battery E directly, or superposing the remaining energy in the charge storage component C1 with the energy in the battery E after some energy in the charge storage component C1 is consumed.

Figure 15:
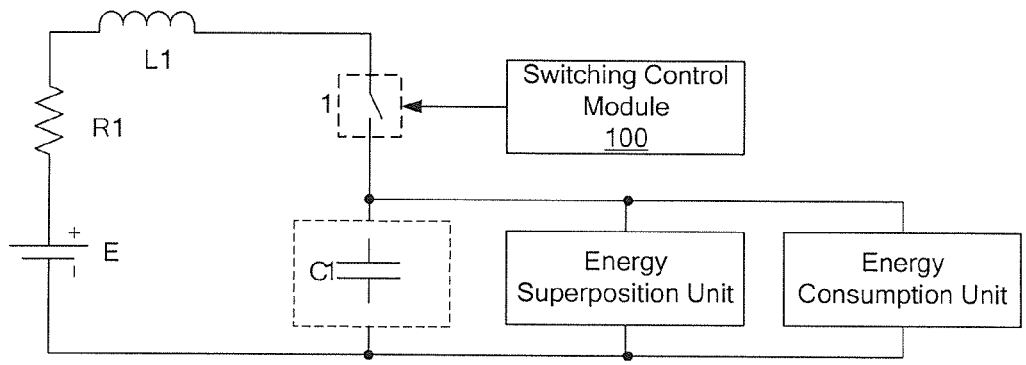
FIG. 15 is a schematic diagram of one embodiment of the battery heating circuit provided in the present invention.

Therefore, as shown in FIG. 15, the heating circuit further comprises an energy consumption unit, which is connected with the charge storage component C1, and is configured to consume the energy in the charge storage component C1 after the switch unit 1 switches on and then switches off and before the energy in the energy superposition unit is superposed.

Figure 16:
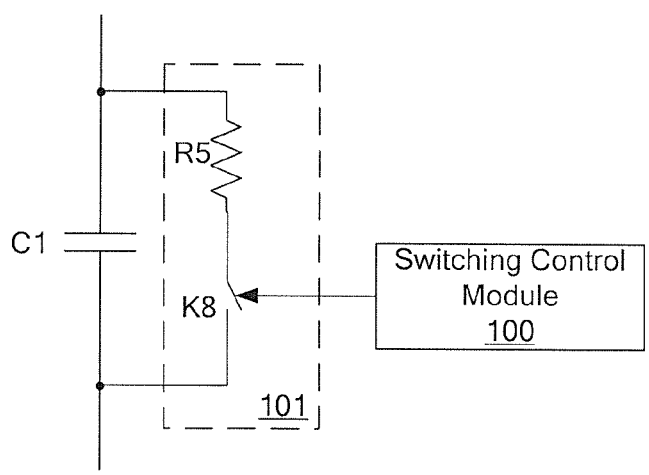
FIG. 16 is a schematic diagram of one embodiment of the energy consumption unit shown in FIG. 15.

In one embodiment of the present invention, as shown in FIG. 16, the energy consumption unit comprises a voltage control unit 101, which is configured to convert the voltage across the charge storage component C1 to a predetermined voltage value after the switch unit 1 switches on and then switches off and before the energy superposition unit performs energy superposition. The predetermined voltage value can be set as needed.

As shown in FIG. 16, the voltage control unit 101 comprises a damping component R5 and a switch K8, wherein: the damping component R5 and switch K8 are connected in series with each other and then connected in parallel across the charge storage component C1; the switching control module 100 is also connected with the switch K8, and is configured to control the switch K8 to switch on after the switch unit 1 switches on and then switches off. Thus, the energy in the charge storage component C1 can be consumed via the damping component R5.

The switching control module 100 can be a separate controller, which, by using internal program setting, enables ON/OFF control of different external switches; or, the switching control module 100 can be a plurality of controllers, for example, a switching control module 100 can be set for each external switch correspondingly; or, the plurality of switching control modules 100 can be integrated into an assembly. Certain embodiments of the present invention do not impose any limitation to the forms of implementation of the switching control module 100.

Hereafter the working principle of the embodiments of heating circuit for battery E will be described briefly with reference to FIGS. 17-22. It should be noted that though the features and components of certain embodiments of the present invention are described specifically with reference to FIGS. 17-22, each feature or component can be used separately without other features and components, or can be used in combination or not in combination with other features and components. The embodiments of the heating circuit for battery E provided in the present invention are not limited to those shown in FIGS. 17-22. In addition, the time intervals between the time periods in the waveform diagram shown in the drawings can be adjusted as needed, according to the actual circumstance.

Figure 17:
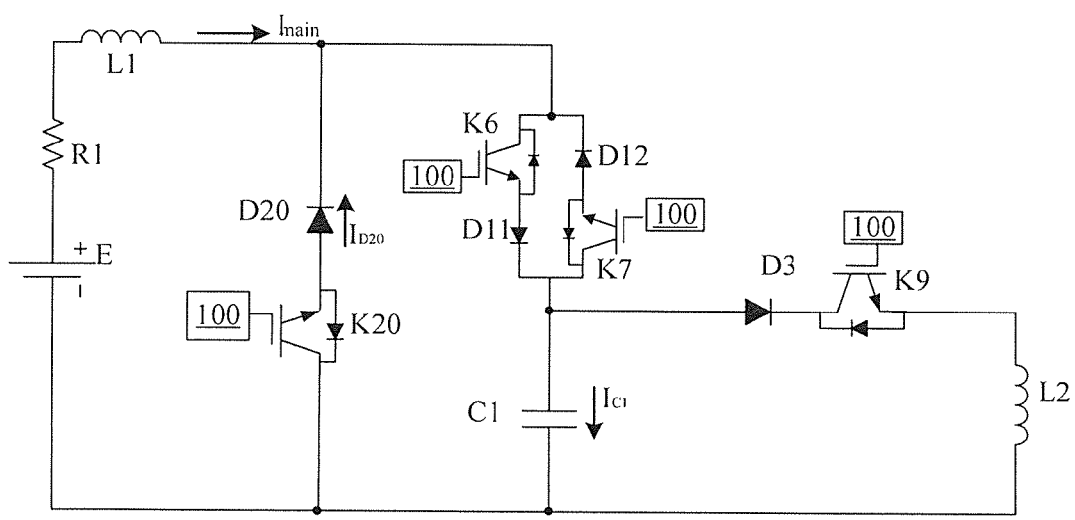
FIG. 17 is a schematic diagram of one embodiment of the battery heating circuit provided in the present invention.
Figure 18:
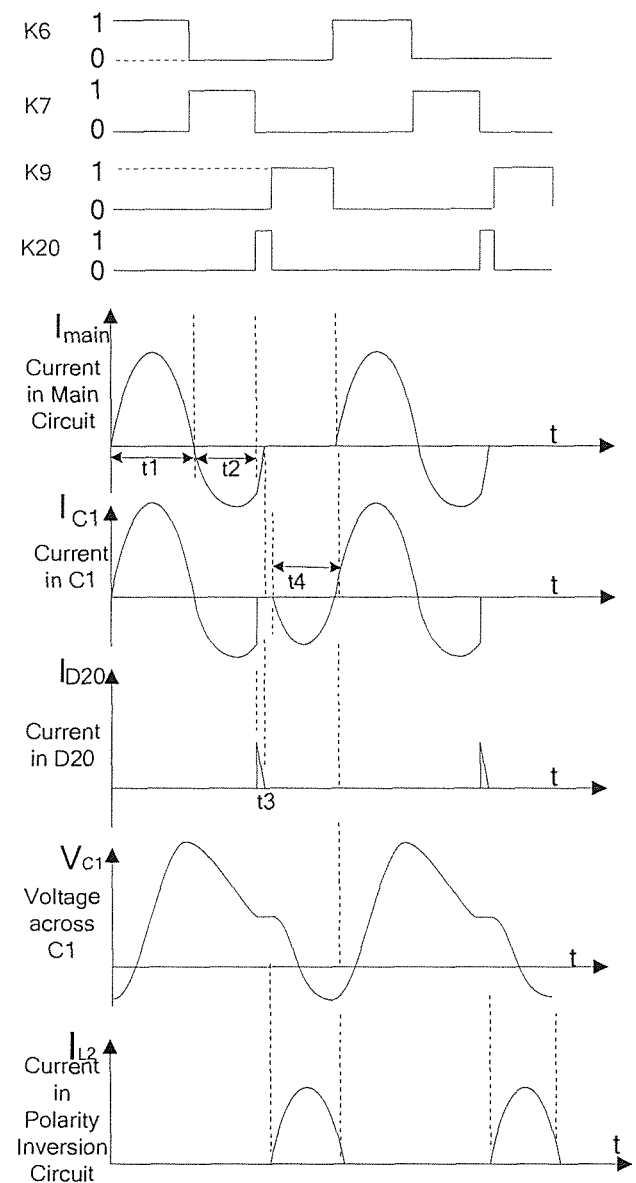
FIG. 18 is a timing sequence diagram of the waveform corresponding to the heating circuit shown in FIG. 17.

In the heating circuit for battery E shown in FIG. 17, the switch K6 and one-way semiconductor component D11 are connected in series to constitute the first one-way branch of the switch unit; the one-way semiconductor component D12 and switch K7 are connected in series to constitute the second one-way branch of the switch unit 1, the switch unit 1, damping component R1, charge storage component C1, and current storage component L1 are connected in series, the one-way semiconductor component D3, current storage component L2, and switch K9 constitute a polarity inversion unit 102, the one-way semiconductor component D20 and the switch K20 constitute a freewheeling circuit 20, the switching control module 100 can control ON/OFF of the switch K6, the switch K7, the switch K9, and the switch K20. FIG. 18 shows a waveform sequence diagram corresponding to the heating circuit shown in FIG. 17, wherein: VC1 refers to the voltage across the charge storage component C1, $I_{main}$ refers to the current flow through the switch unit 1, IL2 refers to the current flow in the polarity inversion circuit, IC1 refers to the current flow through the charge storage component C1, and ID20 refers to the current flow through the one-way semiconductor component D20. The working process of the heating circuit shown in FIG. 17 is as follows:

the switching control module 100 controls the switch K6 to switch on, and thus the battery E discharges in positive direction through the loop composed by the battery E, the switch K6, the one-way semiconductor component D11, and the charge storage component C1 (in the time period t1 shown in FIG. 18);

the switching control module 100 controls the switch K6 to switch off when the current flow reaches zero after the peak value in the first positive half cycle;

the switching control module 100 controls the switch K7 to switch on, and the battery E is charged in reversed direction through the loop composed by the battery E, the charge storage component C1, the switch K7, and the semiconductor device D12; the switching control module 100 controls the switch K7 to switch off when the current flow reaches degree 24 before zero after the peak value in the first negative half cycle (in the time period t2 shown in FIG. 18);

the switching control module 100 controls the switch K20 to switch on when it controls the switch K7 to switch off, and thus the current storage component L1 sustains the current flow via the switch K20 and the one-way semiconductor component D20; the switching control module 100 controls the switch K20 to switch off when the current flow to the battery E reaches zero (in the time period t3 shown in FIG. 18);

the switching control module 100 controls the switch K9 to switch on, and thus the charge storage component C1 discharges through the loop composed by the one-way semiconductor component D3, the current storage component L2, and the switch K9, and thereby attain the purpose of voltage polarity inversion; then, the switching control module 100 controls the switch K9 to switch off (in the time period t4 shown in FIG. 18);

repeat step a) to step e); the battery E is heated up continuously while it discharges and is charged, till the battery E meets the heating stop condition.

Figure 19:
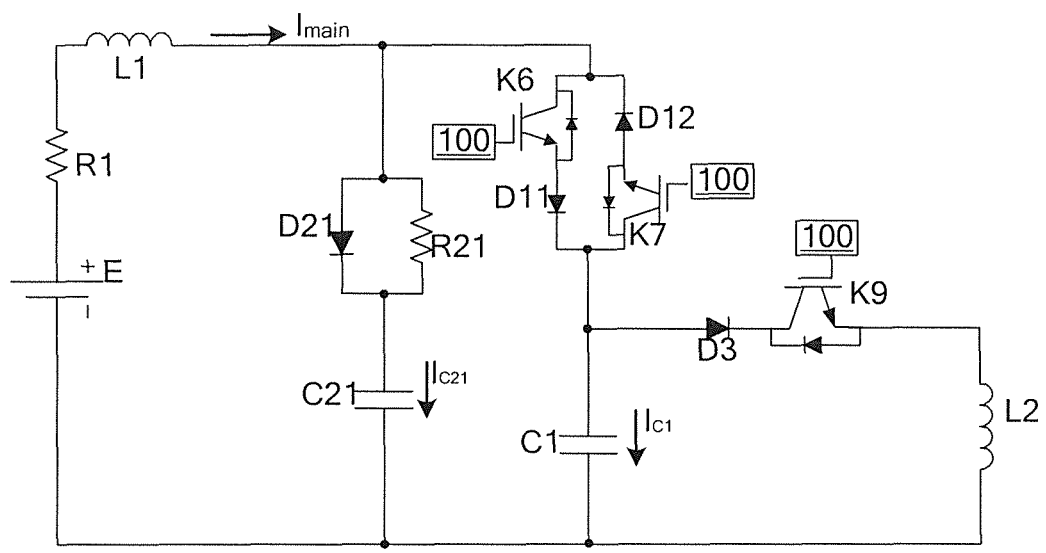
FIG. 19 is a schematic diagram of one embodiment of the battery heating circuit provided in the present invention.
Figure 20:
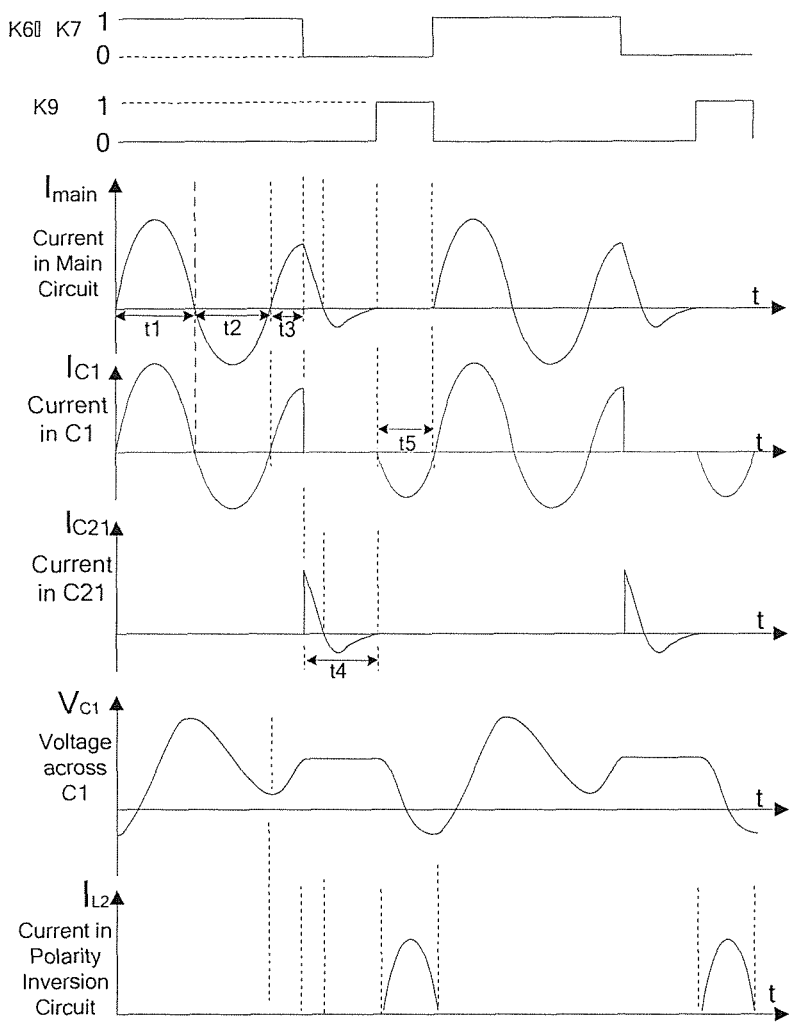
FIG. 20 is a timing sequence diagram of the waveform corresponding to the heating circuit shown in FIG. 19.

In the heating circuit for battery E shown in FIG. 19, the switch K6 and the one-way semiconductor component D11 are connected in series to constitute the first one-way branch of the switch unit 1; the one-way semiconductor component D12 and switch K7 are connected in series to constitute the second one-way branch of the switch unit 1, the switch unit 1, the damping component R1, the charge storage component C1, and the current storage component L1 are connected in series, the one-way semiconductor component D3, the current storage component L2, and the switch K9 constitute a polarity inversion unit 102, the one-way semiconductor component D21, the damping component R21, and the charge storage component C21 constitute a freewheeling circuit 20, the switching control module 100 can control ON/OFF of the switch K6, the switch K7, and the switch K9. FIG. 20 shows a waveform sequence diagram corresponding to the heating circuit shown in FIG. 19, wherein: VC1 refers to the voltage across the charge storage component C1, refers to the current flow through the switch unit 1, IL2 refers to the current flow in the polarity inversion circuit, IC1 refers to the current flow through the charge storage component C1, and IC21 refers to the current flow through the charge storage component C21. The working process of the heating circuit shown in FIG. 19 is as follows:

the switching control module 100 controls the switch K6 and the K7 to switch on, and thus the battery E discharges in normal direction through the loop composed by the battery E, the switch K6, the one-way semiconductor component D11, and the charge storage component C1 (in the time period t1 shown in FIG. 20), and is charged in reversed direction through the loop composed by the battery E, the switch K7, the one-way semiconductor component D12, and the charge storage component C1 (in the time period t2 shown in FIG. 20);

the switching control module 100 controls the switch K6 and the K7 to switch off when the current flow reaches degree 25 after zero before the peak value in the second positive half cycle (in the time period t3 shown in FIG. 20); the current storage component L1 sustains the current flow via the one-way semiconductor component D21 and the charge storage component C21 (in the time period t4 shown in FIG. 20);

the switching control module 100 controls the switch K9 to switch on, and thus the charge storage component C1 discharge through the loop composed by the one-way semiconductor component D3, the current storage component L2, and the switch K9, and attain the purpose of voltage polarity inversion; then, the switching control module 100 controls the switch K9 to switch off (in the time period t5 shown in FIG. 20);

repeat step a) to step c); the battery E is heated up continuously while it discharges and is charged, till the battery E meets the heating stop condition.

It should be noted that there is also current flow in the freewheeling circuit 20 shown in FIG. 19 in the time period t1 and t2. To illustrate clearly the purpose of the freewheeling circuit 20 in the heating circuit provided in certain embodiments of the present invention, only the current flow in the time periods when the effect of the freewheeling circuit 20 is operative is shown in FIG. 20, but the current flow in the freewheeling circuit 20 in the time period t1 and t2 is omitted, to avoid confusion.

Figure 21:
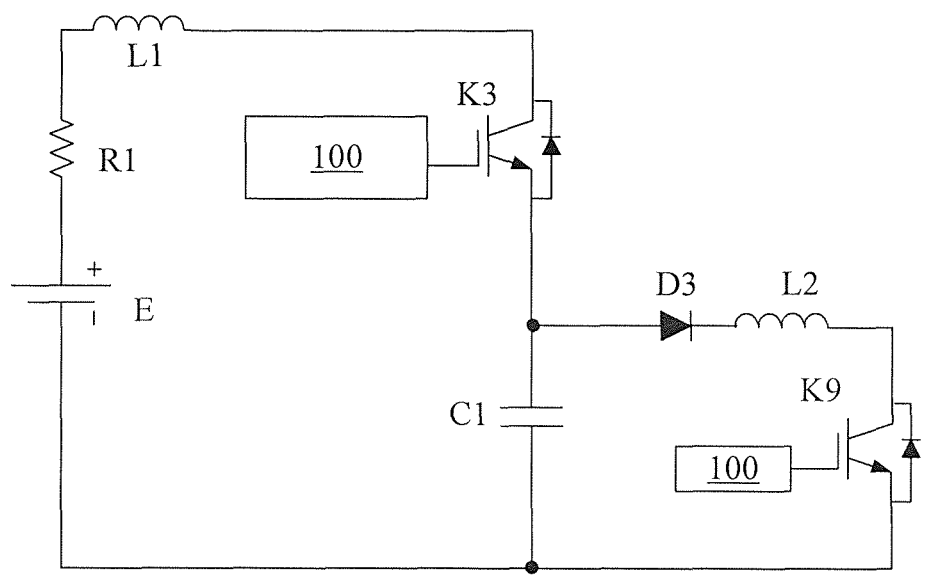
FIG. 21 is a schematic diagram of one embodiment of the battery heating circuit provided in the present invention.
Figure 22:
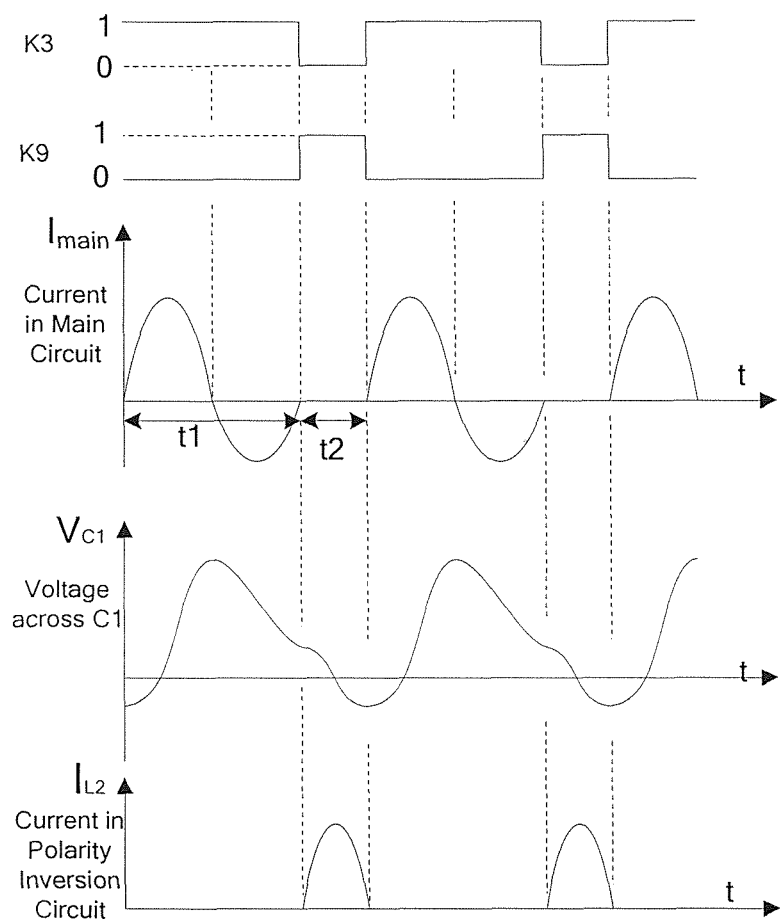
FIG. 22 is a timing sequence diagram of the waveform corresponding to the heating circuit shown in FIG. 21.

In the heating circuit for battery E shown in FIG. 21, a two-way switch K3 is used to form the switch unit 1, the energy storage circuit comprises a current storage component L1 and a charge storage component C1, the damping component R1 and the switch unit 1 are connected in series with the energy storage circuit, the one-way semiconductor component D3, the current storage component L2, and the switch K9 constitute a polarity inversion unit 102, the switching control module 100 can control the switch K9 and the two-way switch K3 to switch on and switch off. FIG. 22 is a timing sequence diagram of the waveform corresponding to the heating circuit shown in FIG. 21, wherein: VC1 refers the voltage value across the charge storage component C1, $I_{main}$ refers to the value of current flow through the two-way switch K3, and IL2 refers to the value of current in the polarity inversion circuit. The working process of the heating circuit shown in FIG. 21 is as follows:

the switching control module 100 controls the two-way switch K3 to switch on, and the energy storage circuit starts operation, as indicated by the time period t1 in FIG. 20; the battery E discharges in normal direction and is charged in reversed direction through the loop composed by the battery E, the two-way switch K3, and the charge storage component C1 (in the time period t1 shown in FIG. 22);

the switching control module 100 controls the two-way switch K3 to switch off when the current flow through the two-way switch K3 reaches zero after the peak value in the negative half cycle (i.e., when the reverse current reaches zero);

the switching control module 100 controls the switch K9 to switch on, and thus the polarity inversion unit 102 starts operation; the charge storage component C1 discharges through the loop composed by the one-way semiconductor component D3, the current storage component L2, and the switch K9, and attain the purpose of voltage polarity inversion; then, the switching control module 100 controls the switch K9 to switch off (in the time period t2 shown in FIG. 22);

repeat step a) to step c); the battery E is heated up continuously while it discharges and is charged, till the battery E meets the heating stop condition.

The heating circuit provided in certain embodiments of the present invention can improve the charge/discharge performance of a battery. In addition, since an energy storage circuit is connected with the battery in series in the heating circuit, the safety problem related with short circuit caused by failures of the switch unit can be avoided when the battery is heated due to the existence of the charge storage component connected in series, and therefore the battery can be protected effectively.

In addition, in the heating circuit provided in certain embodiments of the present invention, since the switching-off opportunity of the switch unit is chosen according to the voltage rating of the switch unit, high induced voltage on the current storage component in the loop and the resultant damage to the switch unit can be prevented, and therefore the heating circuit is safer, and the adverse effect to the entire circuit can be reduced.

In addition, an energy superposition unit is provided in the heating circuit in certain embodiments of the present invention, and the energy superposition unit can superpose the energy in the energy storage circuit with the energy in the battery after the switch unit switches off; thus, the discharging current in the heating circuit will be increased when the switch unit is controlled to switch on at the next time, and therefore the working efficiency of the heating circuit is improved.

For example, some or all components of various embodiments of the present invention each are, individually and/or in combination with at least another component, implemented using one or more software components, one or more hardware components, and/or one or more combinations of software and hardware components. In another example, some or all components of various embodiments of the present invention each are, individually and/or in combination with at least another component, implemented in one or more circuits, such as one or more analog circuits and/or one or more digital circuits.

While some embodiments of the present invention are described above with reference to the accompanying drawings, the present invention is not limited to the details of those embodiments. Those skilled in the art can make modifications and variations, without departing from the spirit of the present invention. However, all these modifications and variations shall be deemed as falling into the scope of the present invention.

In addition, it should be noted that the specific technical features described in the above embodiments can be combined in any appropriate way, provided that there is no conflict. To avoid unnecessary repetition, certain possible combinations are not described specifically. Moreover, the different embodiments of the present invention can be combined as needed, as long as the combinations do not deviate from the spirit of the present invention. However, such combinations shall also be deemed as falling into the scope of the present invention.

Hence, although specific embodiments of the present invention have been described, it will be understood by those of skill in the art that there are other embodiments that are equivalent to the described embodiments. Accordingly, it is to be understood that the invention is not to be limited by the specific illustrated embodiments, but only by the scope of the appended claims.

What is claimed is:

1. A battery heating circuit, comprising a switch unit, a switching control module, a damping component, an energy storage circuit, and an energy superposition unit, wherein:

the energy storage circuit is configured to connect with the battery to form a loop, and comprises a current storage component and a charge storage component;

the damping component, the switch unit, the current storage component, and the charge storage component are connected in series;

the switching control module is connected with the switch unit, and is configured to switch on the switch unit so as to allow current flow from the battery to the energy storage circuit and from the energy storage circuit to the battery and to switch off the switch unit so as to stop the current flow;

the energy superposition unit is connected across the charge storage component, and is configured to superpose the energy in the energy storage circuit with the energy in the battery after the switch unit switches on and then switches off;

the switching control module is also configured to control the switch unit to switch off after the first positive half cycle of the current flow through the switch unit after the switch unit switches on, and the voltage applied to the switch unit at the time the switch unit switches off is lower than the voltage rating of the switch unit.

2. The heating circuit according to claim 1, wherein: the damping component is a parasitic resistance in the battery, and the current storage component is a parasitic inductance in the battery.

3. The heating circuit according to claim 1, wherein: the damping component is a resistor, the current storage component is an inductor, and the charge storage component is a capacitor.

4. The heating circuit according to claim 3, wherein: the energy superposition unit comprises a polarity inversion unit, which is connected across the charge storage component, and is configured to invert the voltage polarity of the charge storage component after the switch unit switches on and then switches off.

5. The heating circuit according to claim 4, wherein:

the polarity inversion unit comprises a first single-pole double-throw switch and a second single-pole double-throw switch located on the two ends of the charge storage component respectively;

the input wires of the first single-pole double-throw switch are connected in the energy storage circuit, the first output wire of the first single-pole double-throw switch is connected with the first pole plate of the charge storage component, and the second output wire of the first single-pole double-throw switch is connected with the second pole plate of the charge storage component;

the input wires of the second single-pole double-throw switch are connected to the energy storage circuit, the first output wire of the second single-pole double-throw switch is connected with the second pole plate of the charge storage component, and the second output wire of the second single-pole double-throw switch is connected with the first pole plate of the charge storage component;

the switching control module is also connected with the first single-pole double-throw switch and second single-pole double-throw switch respectively, and is configured to invert the voltage polarity of the charge storage component by altering the connection relationships between the respective input wires and output wires of the first single-pole double-throw switch and the second single-pole double-throw switch.

6. The heating circuit according to claim 4, wherein:

the polarity inversion unit comprises a one-way semiconductor component, a current storage component, and a switch;

the charge storage component, current storage component, and switch are connected sequentially in series to form a loop;

the one-way semiconductor component is connected in series between the charge storage component and the current storage component or between the current storage component and the switch;

the switching control module is also connected with the switch, and is configured to invert the voltage polarity of the charge storage component by controlling the switch to switch on.

7. The heating circuit according to claim 4, wherein:

the polarity inversion unit comprises a DC-DC module and a second charge storage component;

the DC-DC module is connected with the charge storage component and the second charge storage component respectively;

the switching control module is also connected with the DC-DC module, and is configured to transfer the energy in the charge storage component to the second charge storage component by controlling the operation of the DC-DC module, and then transfer the energy in the second charge storage component back to the charge storage component so as to invert the voltage polarity of the charge storage component.

8. The heating circuit according to claim 1, wherein: the switch unit is a two-way switch.

9. The heating circuit according to claim 1, wherein:

the switch unit comprises a first one-way branch configured to enable energy flow from the battery to the energy storage circuit and a second one-way branch configured to enable energy flow from the energy storage circuit to the battery;

the switching control module is connected to the first one-way branch and the second one-way branch, respectively, and is configured to control switching the switch unit on or off by controlling turning the connected branches on or off.

10. The heating circuit according to claim 9, wherein:

the switch unit comprises a first two-way switch and a second two-way switch, the first two-way switch and the second two-way switch are connected in series opposite to each other to form the first one-way branch and the second one-way branch;

the switching control module is connected with the first two-way switch and second two-way switch respectively, and is configured to control turning the first one-way branch and the second one-way branch on or off by controlling turning the first two-way switch and second two-way switch on or off.

11. A battery heating circuit, comprising a switch unit, a switching control module, a damping component, an energy storage circuit, and an energy superposition unit, wherein:

the energy storage circuit is configured to connect with the battery to form a loop, and comprises a current storage component and a charge storage component;

the damping component, the switch unit, the current storage component, and the charge storage component are connected in series;

the switching control module is connected with the switch unit, and is configured to control ON/OFF of the switch unit so as to control the energy flowing between the battery and the energy storage circuit;

the energy superposition unit is connected with the energy storage circuit, and is configured to superpose the energy in the energy storage circuit with the energy in the battery after the switch unit switches on and then switches off;

the switching control module is also configured to control the switch unit to switch off after the first positive half cycle of the current flow through the switch unit after the switch unit switches on, and the voltage applied to the switch unit at the time the switch unit switches off is lower than the voltage rating of the switch unit;

the switch unit comprises a first one-way branch configured to enable energy flow from the battery to the energy storage circuit and a second one-way branch configured to enable energy flow from the energy storage circuit to the battery;

the switching control module is connected to the first one-way branch and the second one-way branch, respectively, and is configured to control ON/OFF of the switch unit by controlling ON/OFF of the connected branches; and the switch unit comprises a first switch, a first one-way semiconductor component, a second switch, and a second one-way semiconductor component;

the first switch and the first one-way semiconductor component are connected with each other in series to constitute the first one-way branch;

the second switch and the second one-way semiconductor component are connected in series with each other to constitute the second one-way branch;

the switching control module is connected with the first switch and the second switch, and is configured to control ON/OFF of the first one-way branch and the second one-way branch by controlling ON/OFF of the first switch and the second switch.

12. The heating circuit according to claim 9, wherein: the switch unit further comprises a resistor connected in series with the first one-way branch and/or the second one-way branch.

13. The heating circuit according to claim 1, wherein: the switching control module is configured to control the switch unit to switch off when the current flow through the switch unit reaches zero after the peak value in the negative half cycle after the switch unit switches on.

14. The heating circuit according to claim 1, further comprising a freewheeling circuit, which is configured to form a serial loop with the battery to sustain the current flow in the battery after the switch unit switches on and then switches off.

15. The heating circuit according to claim 14, wherein:

the freewheeling circuit comprises a switch and a one-way semiconductor component connected in series with each other;

the switching control module is connected with the switch, and is configured to control the switch to switch on after the switch unit switches on and then switches off, and control the switch to switch off when the current flow to the battery reaches a preset value of current.

16. The heating circuit according to claim 14, wherein:

the freewheeling circuit comprises a one-way semiconductor component, a second damping component, and a second charge storage component;

the one-way semiconductor component and the second damping component are connected in parallel with each other, and then connected in series with the second charge storage component.

17. The heating circuit according to claim 1, wherein: the heating circuit further comprises an energy consumption unit, which is connected with the charge storage component and configured to consume the energy in the charge storage component after the switch unit switches on and then switches off and before the energy superposition unit performs energy superposition.

18. The heating circuit according to claim 17, wherein: the energy consumption unit comprises a voltage control unit, which is connected with the charge storage component, and is configured to convert the voltage across the charge storage component to a predetermined voltage value after the switch unit switches on and then switches off and before the energy superposition unit performs energy superposition.

19. The heating circuit according to claim 18, wherein:
the voltage control unit comprises a second damping component and a switch;
the second damping component and the switch are connected with each other in series, and then connected in parallel across the charge storage component;
the switching control module is also connected with the switch, and is configured to control the switch to switch on after the switch unit switches on and then switches off.

* * * * *